(12) United States Patent
Mitsui

(10) Patent No.: US 7,526,408 B2
(45) Date of Patent: Apr. 28, 2009

(54) MEASUREMENT SYSTEM AND METHOD AND COMPUTER PROGRAM FOR PROCESSING MEASUREMENT DATA

(75) Inventor: Tadashi Mitsui, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/117,387

(22) Filed: Apr. 29, 2005

(65) Prior Publication Data

US 2005/0256669 A1 Nov. 17, 2005

(30) Foreign Application Priority Data

Apr. 30, 2004 (JP) ............................. 2004-135757

(51) Int. Cl.
*G06F 11/30* (2006.01)
(52) U.S. Cl. ..................................... 702/182
(58) Field of Classification Search ................ 702/182, 702/127; 370/254
See application file for complete search history.

(56) References Cited

U.S. PATENT DOCUMENTS

| 6,243,738 | B1 | 6/2001 | Hayles et al. | |
| 6,662,142 | B2 | 12/2003 | Shiba | |
| 6,873,601 | B1 * | 3/2005 | Chow et al. | 370/254 |
| 2006/0015285 | A1 * | 1/2006 | Fuller et al. | 702/127 |
| 2008/0106597 | A1 * | 5/2008 | Amini et al. | 348/143 |

FOREIGN PATENT DOCUMENTS

| JP | 9-151304 | 6/1997 |
| JP | 2002-016599 | 1/2002 |
| JP | 2002-203760 | 7/2002 |

\* cited by examiner

*Primary Examiner*—Tung S Lau
*Assistant Examiner*—Xiuquin Sun
(74) *Attorney, Agent, or Firm*—Finnegan, Henderson, Farabow, Garrett & Dunner, L.L.P.

(57) ABSTRACT

A measurement system includes a measurement apparatus, a client computer, and a server computer. The server computer includes a setting edition unit configured to prepare/edit set contents of a recipe of the measurement apparatus from the client computer, a notification unit configured to notify the measurement apparatus of at least one execution request included in the recipe prepared/edited by the client computer, a data processing unit configured to process data acquired by the recipe whose execution request has been notified by the measurement apparatus based on setting information input from the client computer, and a result display unit configured to display a processing result of the data processing unit in the client computer.

24 Claims, 9 Drawing Sheets

1A

MEASUREMENT SYSTEM AND METHOD AND COMPUTER PROGRAM FOR PROCESSING MEASUREMENT DATA

CROSS REFERENCE TO RELATED APPLICATIONS

This application is based upon and claims the benefit of priority under 35 USC § 119 from Japanese Patent Application No. 2004-135757 filed on Apr. 30, 2004; the entire contents of which are incorporated herein by reference.

BACKGROUND

The present application relates to a measurement system, and a method and computer program for processing measurement data, particularly to a measurement system, method and computer program for use in pattern measurement or the like.

With development of a fine processing technique such as a semiconductor manufacturing technique for manufacturing a semiconductor for use in various circuits, a liquid crystal display and the like, a measurement system has rapidly advanced/developed for processing image data and numerical data which are obtained by measuring objects processed by the fine processing technique.

As shown in FIG. 8 which is a schematic diagram showing a conventional measurement system, a conventional measurement system 1 comprises a host computer 2 and a plurality of measurement apparatuses 4 and 5. The measurement apparatus 4 includes, for example, an image processing unit 8 which subjects a measurement result to image processing. The measurement apparatus 5 includes an image processing unit 9.

A user A individually issues a recipe with respect to the measurement apparatus 4 or 5, and allows the measurement apparatus 4 or 5 to individually execute a measurement process. A user B individually issues a recipe with respect to the measurement apparatus 5 or 4, and allows the measurement apparatus 5 or 4 to individually execute a measurement process. Here, the recipe refers to a setting file of a measurement sequence or a control parameter to each measurement apparatus, and the recipe includes a setting for image acquisition and that for measurement.

In the conventional measurement system 1, the individual user A or B prepares a predetermined recipe for the measurement to issue the recipe to the measurement apparatus 4 or 5. On receiving the recipe, the measurement apparatus 4 or 5 performs measurement in accordance with the recipe of the measurement issued by the measurement apparatus 4 or 5 to display the results. After the image processing unit 8 or 9 performs predetermined image processing in accordance with the recipe for acquiring the image, measurement data is displayed.

In FIG. 8, each user prepares the recipe using a recipe preparation program provided by the apparatus. When the prepared recipe is designated, and executed, an image or a numerical value of a measurement object pattern can be obtained, and the obtained image is measurement by the image processing executed in the apparatus. The measurement result can be stored in the apparatus or the host computer 2, and referred to. Thus, according to the conventional system, a series of procedure has to be constantly performed with respect to the measurement apparatus 4 or 5 which is a target in order to prepare the recipe, execute measurement of the acquired image, and obtain a predetermined result.

Since the measurement mentioned here is abstract, an example of the measurement will be described hereinafter. As the example, there is critical dimension measurement (CD measurement) of a fine pattern formed in steps of manufacturing the semiconductor, including a lithography step and an etching step. A conventional technique and problem will be described. A technical field to which the measurement is applied is not limited to the CD measurement. The technical field is applied as a user support system relating to a general measurement process of a production line in various other industrial fields. For example, in a semiconductor manufacturing line, it is possible to utilize a system by the present proposal even in misalignment measurement, film thickness measurement and the like. The system by the proposal is also usable in measurement of a linear width of a transistor in a line for manufacturing a thin film transistor (TFT) liquid crystal panel.

In order to evaluate a fine pattern of the semiconductor, the CD measurement is performed using a critical dimension scanning electron-beam microscope (CDSEM). In this CDSEM, measurement data of dimension or the like of each pattern portion is acquired based on a SEM image of a measurement target pattern. These measurement data is stored in a hard disc (HD) connected to the host computer or the like connected to an engineering workstation (EWS) or high-order communication. The user accesses the data to obtain a desired measurement result.

A program for executing a measurement algorithm provided by the apparatus is stored in the EWS of the apparatus. Therefore, the user who cannot be satisfied with the function basically provided by the apparatus requires extensions of apparatus software with respect to an apparatus manufacturer, and requests the manufacturer to handle the extensions. The user depends on the apparatus manufacturer in this conventional way, and large burdens are imposed on the user together with cost and time.

However, in recent years, requirements for the measurement have been remarkably diversified. There are increasingly users who cannot be satisfied with the functions provided with the apparatus mainly in a research development field, and the conventional way cannot catch up with the requirements in a conspicuous case. For example, in recent years, the users increase who demand for more sophisticated image analysis (image processing, image measurement) such as automatic production of a recipe for measuring a position requiring measurement, extracted by yield simulation based on a computer-aided design (CAD) layout, measurement of an optical proximity correction (OPC) shape of reticle, and roughness measurement of a line.

However, since all the users do not require the functions, the apparatus manufacturers hesitate to perform development, and there has not been a flexible type of apparatus capable of completely satisfying the requirements in the present situation. Furthermore, it is necessary to individually consider user's various tastes or local circumstances in a data visualizing function such as various data analysis and graph preparation, but it is actually unreasonable to handle all of them.

Thus, there are three demerits as follows in a case where the enhancement of the function of the measurement apparatus depends on the manufacturer of the apparatus. The first demerit is that user's problem has to be disclosed with respect to the apparatus manufacturer, but this is not preferable from a viewpoint of confidentiality in some case. As the second demerit, in a case where manufacturers' expectations do not agree with users' needs, the users need to give up their needs. Even if the needs are satisfied, much cost and time are required. That is, in a certain plant, it is impossible to develop a technique for solving a problem caused in the morning by the end of the day, and to adapt to the developed technique. As the third demerit, even in a case where a solution to the problem has been already opened by the user, it depends on the apparatus manufacturer's discretion whether or not to accept and incorporate the solution as the function of the apparatus.

In this conventional passive way in which the enhancement of the function of the apparatus depends on the manufacturer, the user cannot but wait for the solution on the manufacturer side. Therefore, it has been increasingly recognized that the user needs to perform the enhancement as much as possible. For example, the user directly accesses the stored image via a network, and executes the image processing by a user's local personal computer (PC) to output a desired result. As application for use in this image processing, commercial general-purpose software has limits in the function and performance. Therefore, application/software for exclusive use has been opened.

Also in these cases, there are three problems as follows. First, there is a problem that application for exclusive use is used only in a specific user's local environment, and cannot be easily shared by many users. Secondly, there is a problem that the performance of the application for exclusive use, for example, an execution speed largely depends on the user's PC environment. Thirdly, there is a problem that it is difficult to manage version of the exclusive-use application once installed in the local PC by improvement or the like, and user's confusion is easily caused in a case where a plurality of exclusive-use applications exist and use environments are not integrated.

Moreover, there is also a problem that user's convenience is deteriorated as follows. That is, although the measurement is executed in the user's local environment, it is still necessary to face a screen of the apparatus in preparing the measurement recipe for acquiring the image. There are apparatus manufacturers which prepare software for preparing an offline/recipe as an option. Even when the option is prepared, a trouble of entering a clean room to move to the apparatus is only saved, and a problem still remains that two types of software for the recipe preparation and the measurement have to be operated in separate computers.

Furthermore, to measure/process images acquired by measurement apparatuses manufactured by different apparatus manufacturers by the same measurement algorithm, a plurality of measurement recipes have to be prepared by separate software using a plurality of computers, and the trouble of the recipe preparation is large as compared with a trouble required for the measurement itself.

In Japanese Patent Application Laid-Open No. 9-151304, a smart hub apparatus has been described comprising: a plurality of manufacturing apparatuses for performing processes; a plurality of client computers for controlling the apparatuses; conveying means for conveying a processed processing object material to a post-process manufacturing apparatus from a preprocess manufacturing apparatus; a server computer which performs the process in response to request of the client computer; and a network connected to a plurality of client computers and the server computer, so that variance control is executed for each manufacturing apparatus. In Japanese Patent Application Laid-Open No. 2002-16599, a network measurement control system has been described in which network traffic is measured with a meter, and measured data is transmitted to a control server. The control server holds policy of quality guarantee control or the like of a communication service, and analyzes the measured data collected from the meter to transmit a control instruction to an object apparatus such as a router in accordance with the policy. The router executes control in accordance with the control instruction, and accordingly careful communication service quality guarantee control is possible in accordance with a situation of the network. In Japanese Patent Application Laid-Open No. 2002-203760, a system has been disclosed comprising: at least one remote workstation connected to a local area network station via a remote access link; and a test system connected to the local workstation via a link. The system is capable of remotely operating and monitoring the test system of a semiconductor, and receiving data remotely from the test system of the semiconductor to test a chip in a position far from a physical test device.

As described above, in the conventional measurement system, the specific user A or B prepares and issues the recipe with respect to the specific measurement apparatus 4 or 5, and the measurement apparatus 4 or 5 which has received the recipe executes the recipe issued to the apparatus. That is, in the conventional measurement system, a process between client/server cannot be performed with respect to a plurality of measurement apparatuses, and it has been general to issue individual recipes to the individual measurement apparatuses by the individual users. Therefore, there are some manufacturers which provide systems as options, the systems comprise exclusive-use workstations for preparing recipes, and the recipes are shared as databases among different measurement apparatuses.

However, the only apparatuses manufactured by the same manufacturer share the recipe, and there has been a problem that users having a plurality of apparatuses by different manufacturers cannot share the recipe. Furthermore, even in the measurement apparatuses by the same manufacturer, a measurement method which can be described in the recipe is executable only in a range supported by the measurement apparatus, and it has been impossible to realize more sophisticated image analysis (image processing and image measurement).

There has been a demand for a measurement system in which a logic process server is disposed between a plurality of client computers and a plurality of measurement apparatuses. Accordingly, the process between client/server in the measurement system is possible, the preparation of the recipe among a plurality of apparatuses is possible, and image data or numerical data can be processed altogether which are measurement results. There has also been a demand for a measurement system capable of supporting not only a laboratory for performing the measurement, a manager of a plant measurement line, and a process development engineer but also measurement in a mass-production plant.

SUMMARY

According to a first aspect of the present invention, a measurement system comprises: at least one measurement apparatus connected to a computer network; a client computer; and a server computer, the server computer comprising: a setting edition unit configured to prepare/edit set contents of a recipe of the measurement apparatus, by the client computer; a notification unit configured to notify the measurement apparatus of at least one execution request included in the recipe prepared/edited by the client computer; a data processing unit configured to process data acquired by the recipe whose execution request has been notified by the measurement apparatus based on setting information input from the client computer; and a result display unit configured to display on the client computer a processing result of the data processing unit According to a second aspect of the present invention, a method for processing measurement data including image data and numerical data being obtained after measuring an object being finely processed and processing the measurement data by using a measurement system including at least one measurement apparatus connected to a computer network, a client computer, and a server computer, the server computer which includes at least a setting edition unit, a notification unit, a data processing unit, and a result display unit, the method comprising: preparing/editing set contents of a recipe of the measurement apparatus from the client computer by the setting edition unit; notifying the measurement apparatus of at least one execution request included in the recipe prepared/edited by the client computer by the notification unit; processing data acquired by the recipe whose execution request has been notified by the measurement apparatus based on setting information input from the client computer by the data processing unit; and displaying a processing result of the data processing unit on the client computer by the result display unit.

According to a third aspect of the present invention, a computer program for processing measurement data including image data and numerical data being obtained after measuring an object being finely processed and processing the measurement data by using a measurement system including at least one measurement apparatus connected to a computer network, a client computer, and a server computer, the server computer which includes at least a setting edition unit, a notification unit, a data processing unit, and a result display unit, the computer program comprising: preparing/editing set contents of a recipe of the measurement apparatus from the client computer by the setting edition unit; of notifying the measurement apparatus of at least one execution request included in the recipe prepared/edited by the client computer by the notification unit; processing data acquired by the recipe whose execution request has been notified by the measurement apparatus based on setting information input from the client computer by the data processing unit; and displaying a processing result of the data processing unit on the client computer by the result display unit.

DESCRIPTION OF THE EMBODIMENTS

Embodiments of a measurement apparatus will be described hereinafter in detail with reference to the accompanying drawings.

First Embodiment

First, an example of a measurement system will be described as a measurement system by a first embodiment in detail with reference to FIGS. 1 and 2. The measurement system provides services such as recipe preparation, image processing, and measurement with respect to a user.

Figure 1:
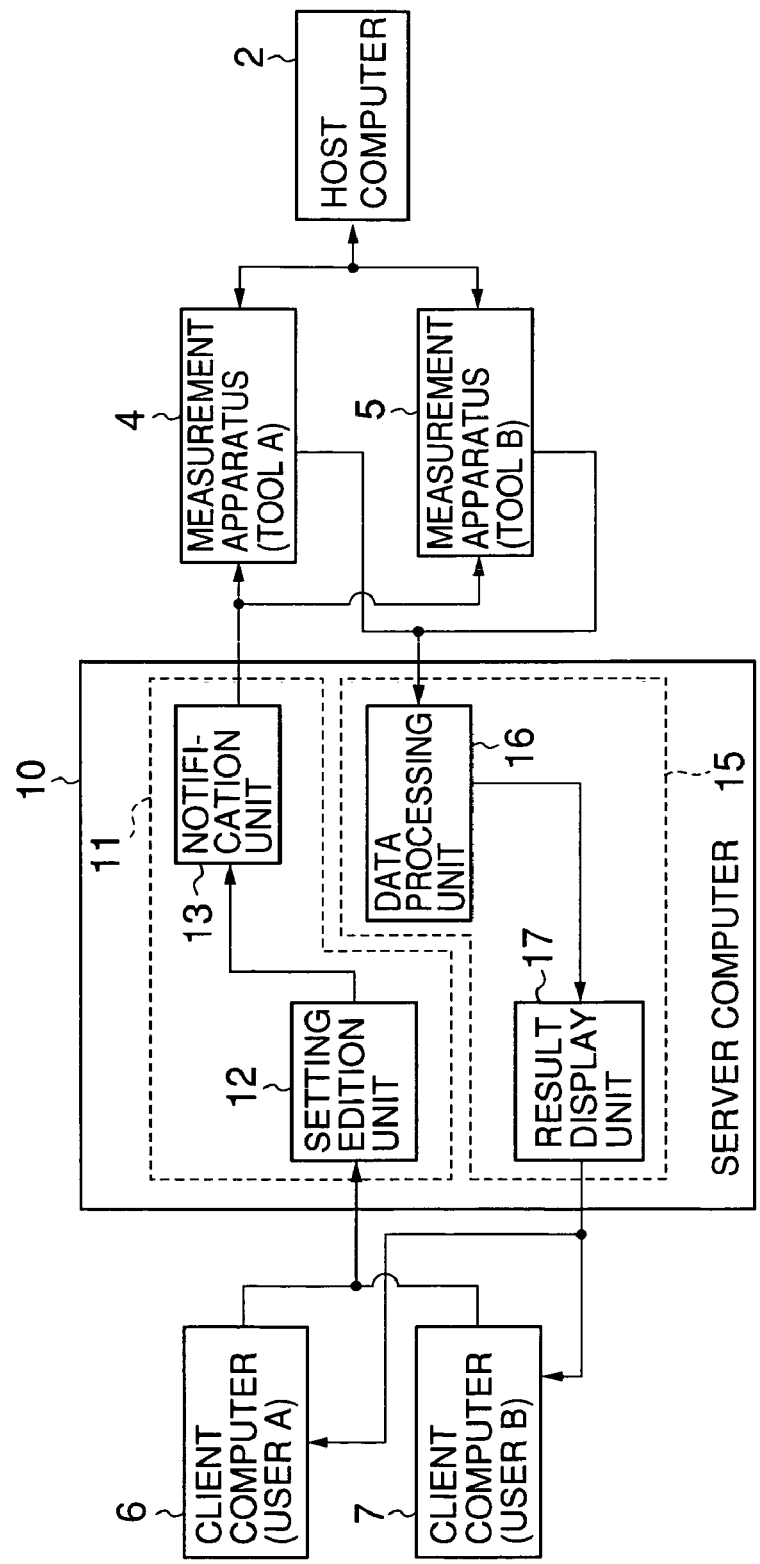
FIG. 1 is a block diagram showing a constitution of a measurement system according to a first embodiment including a basic principle.

As shown in FIG. 1, a measurement system 1A according to the first embodiment includes a plurality of measurement apparatuses 4 and 5 connected to a computer network 3 including a host computer 2; client computers 6 and 7; and a server computer 10. The server computer 10 includes a setting edition unit 12 which prepares/edits set contents of recipes of the measurement apparatuses 4 and 5 from the client computer 6 or 7; a notification unit 13 which notifies the measurement apparatuses 4 and 5 of at least one execution request included in the recipe prepared/edited by the client computers 6 and 7; a data processing unit 16 which processes data acquired by the recipe whose execution request has been notified by the measurement apparatuses 4 and 5 based on setting information input from the client computers 6 and 7; and a result display unit 17 which displays a processing result of the data processing unit 16 in the client computers 6 and 7.

The setting edition unit 12 and the notification unit 13 function as a recipe preparation unit 11 which prepares/edits the recipe based on setting information input from the client computers 6 and 7 to issue the recipe to the measurement apparatuses 4 and 5. The data processing unit 16 and the result display unit 17 function as an image processing unit 15 in a case where measurement data acquired from the measurement apparatuses 4 and 5 are image data. According to FIG. 2 showing the measurement system of the first embodiment corresponding to a conventional measurement system shown in FIG. 8, a logic process server 10 comprises the recipe preparation unit 11 and the image processing unit 15.

Figure 8:
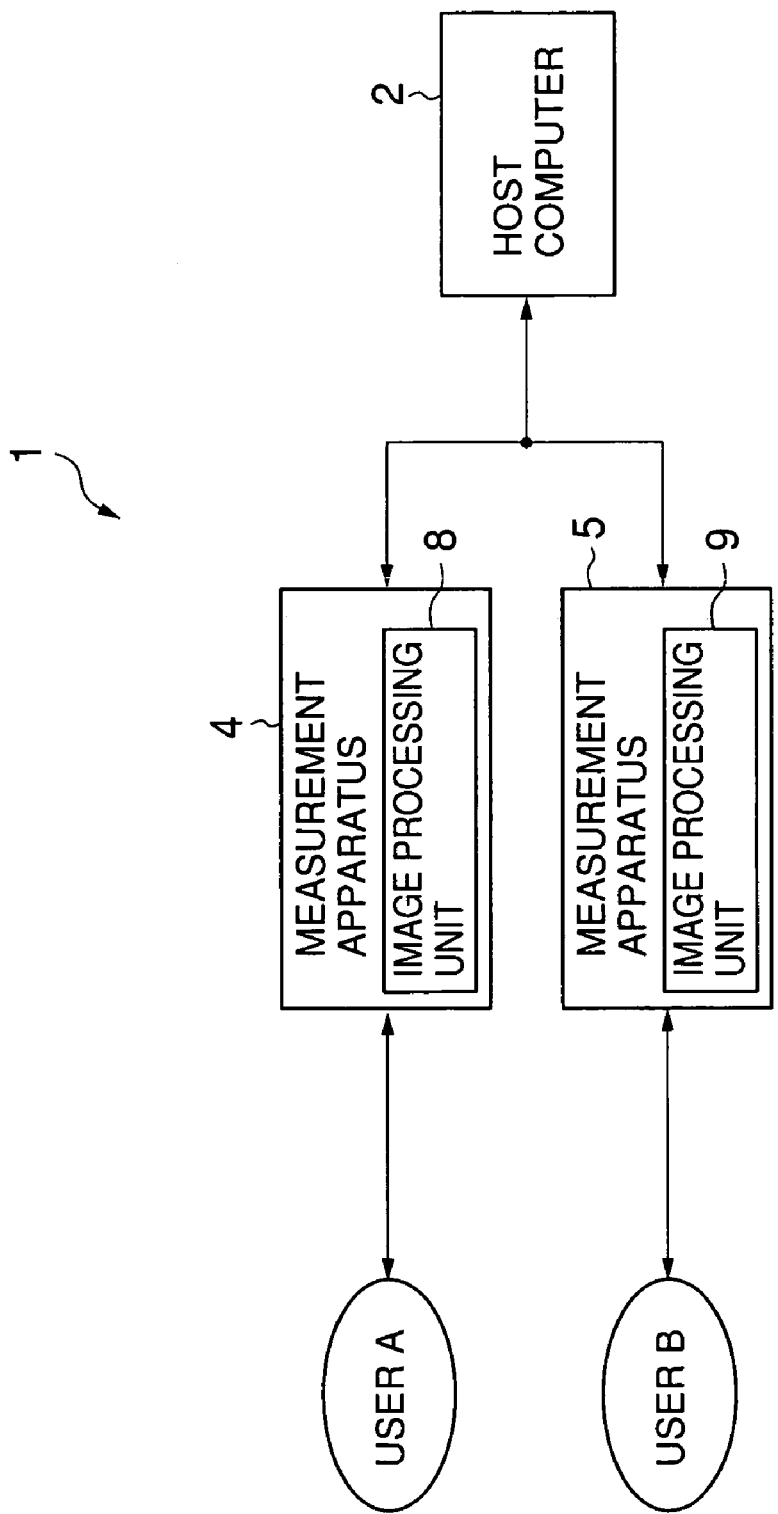
FIG. 8 is a block diagram showing one example of a specific constitution of a conventional measurement system.

In the conventional measurement system described with reference to FIG. 8, the user prepares a recipe using a recipe preparation program provided by the measurement apparatus, and designates the prepared recipe to execute the recipe. Accordingly, an image of a measurement object pattern can be obtained, and the image is measured by image processing executed in the measurement apparatus. A measurement result is stored in the measurement apparatuses 4 and 5 or the host computer 2, and can be referred to via a terminal monitor. Thus, according to the conventional system, to prepare the recipe, execute measurement of the acquired image, and obtain a desired result, it has been constantly necessary to perform a series of procedure with respect to the measurement apparatus 4 or 5 which is a target. The recipe used in the conventional measurement apparatus includes a recipe for acquiring the image, and a recipe for the measurement as described above.

Figure 2:
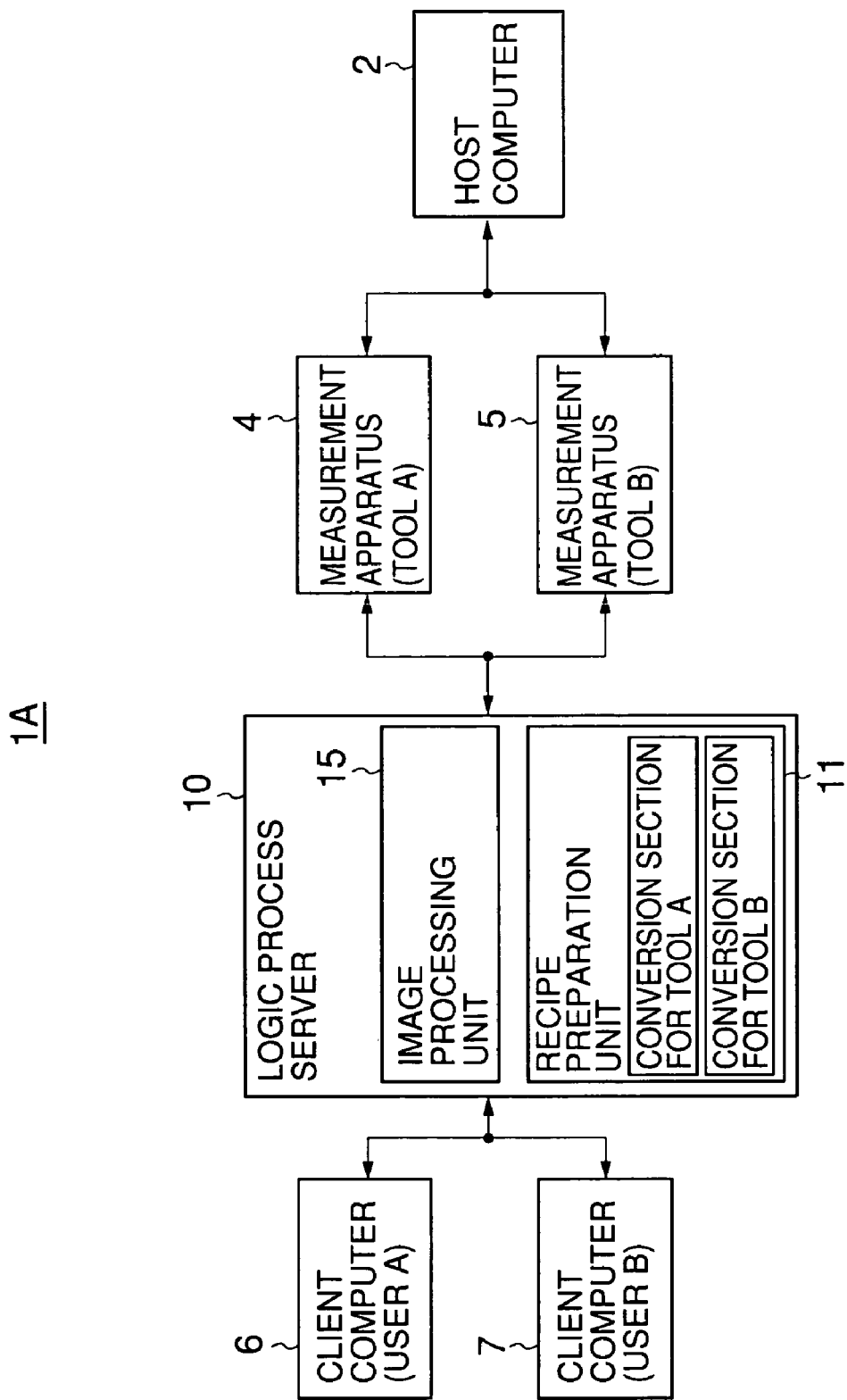
FIG. 2 is a block diagram similarly showing the constitution of the measurement system according to the first embodiment.

On the other hand, according to the measurement system 1A of the first embodiment shown in the schematic diagram of FIG. 2, the user prepares the recipe using the recipe preparation program provided by the server in a user's local environment to transfer/store the recipe to the measurement apparatus 4 or 5. In this case, the server converts the recipe into a recipe format which differs with each type of apparatus. The recipe format includes a template of pattern matching. For example, a bit map image executed from CAD data is converted into an image format inherent in a pattern matching engine of the apparatus. Therefore, the recipe for use in the measurement system according to the present proposal includes a recipe for the measurement system in addition to the conventional recipes including the recipe for acquiring the image and the recipe for the measurement for use in the individual measurement apparatuses. The recipe for the measurement system includes: a recipe for an image, which issues a job ID to the recipe for acquiring the image in a general recipe; and a recipe for measurement macro, for measuring an image prepared by a general recipe and sent together with the added job ID.

The user designates a file of the recipe stored in the apparatus or an arbitrary position of a network via the network, and requests the server to execute the recipe. The server transmits, to the measurement apparatus, an instruction to start the measurement together with a recipe file name. Thereafter, a wafer to be measured is set to the apparatus by the user or an apparatus operator. An image of a measurement object pattern is acquired in accordance with the designated recipe, and the image is stored directly in the measurement apparatus, or a server or the like which can be referred to via the network. To obtain measurement data such as pattern CD from these images, the user acquires desired data using an image processing program provided by the server.

The image processing is executed as a package including the measurement execution by the server. The measurement result is stored in a database or the like on the network via the server, and can be referred to from the user's local environment. Also in this system, the measurement is executed by the apparatus in the same manner as in the conventional system, and the result may be stored in the apparatus, host computer and the like in the same manner as in the conventional system. In this case, needless to say, the result is limited to a result by a measurement algorithm provided by the measurement apparatus. In comparison of FIG. 8 with FIG. 2, FIG. 8 is largely different in evaluation concerning handling of the image because the conventional measurement system only acquires the image.

As apparent from FIG. 2, the measurement system of the first embodiment is characterized in that the user can access the measurement apparatus via a single interface (I/F), even when the measurement apparatuses by a plurality of apparatus manufacturers exist in the system. That is, it is possible to prepare the recipe, measure the acquired image, and analyze the result at user's will without troubling a vendor in extensions of the measurement apparatus or the like, or without being bound by restrictions attributable to the apparatus. Thus, an essence of the measurement system according to the first embodiment lies in that the apparatus hides from user's sight behind the system, and the user recognizes the apparatus as a service capable of obtaining the result without being conscious of the apparatus. The server for actually preparing the measurement recipe and measuring the acquired image to analyze the result will be referred to as the logic process server 10.

Second Embodiment

Figure 3:
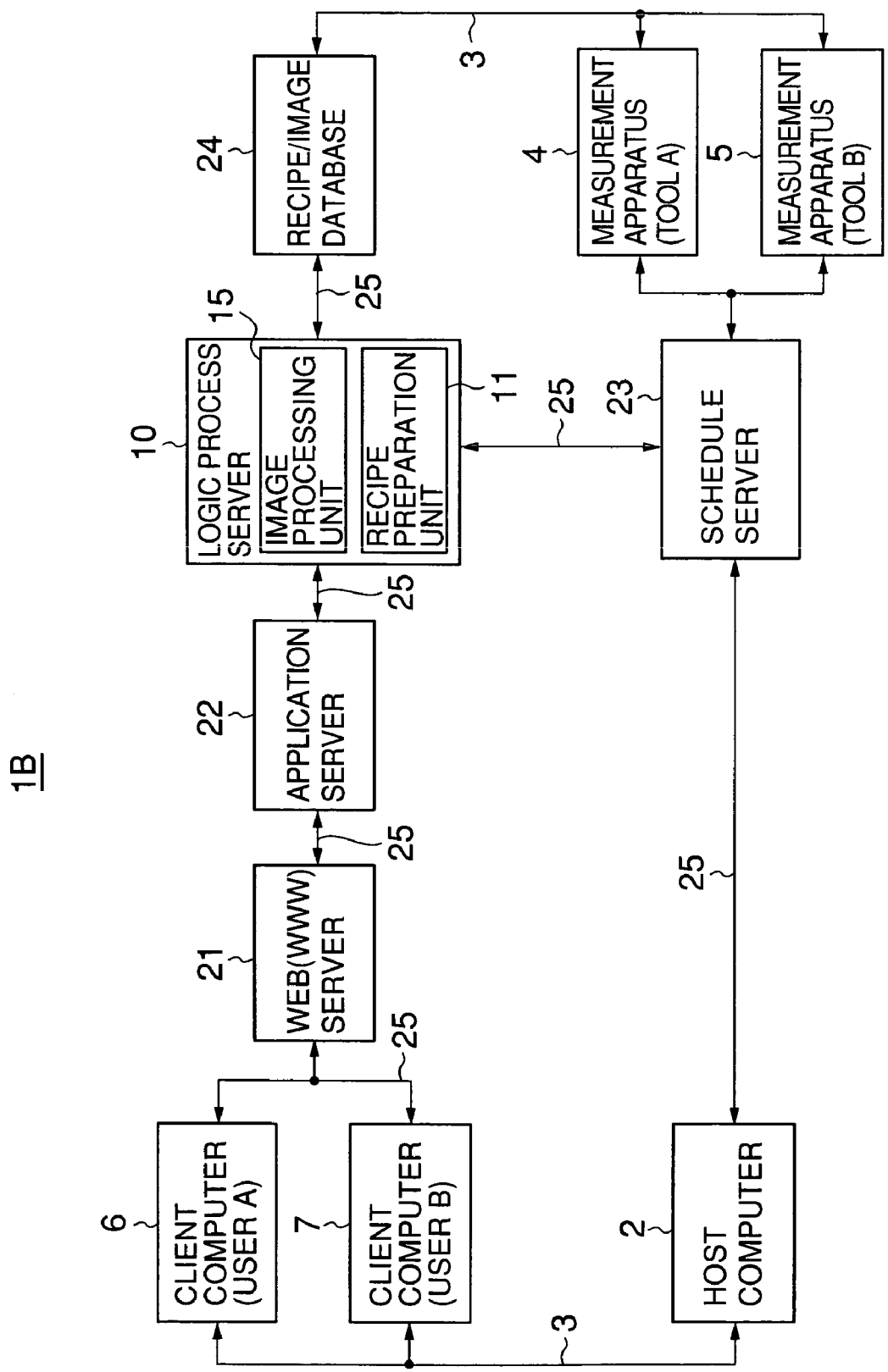
FIG. 3 is a block diagram showing a constitution of a measurement system according to a second embodiment applied to an online measurement system.

Next, as another embodiment of a measurement system, a measurement system according to a second embodiment will be described hereinafter with respect to a block diagram shown in FIG. 3. In the present embodiment, the system is opened in a mass-production plant. In FIG. 3, various servers 10, 21 to 23, and a database 24 are connected via an intranet 25. A measurement system 1B according to the second embodiment shown in FIG. 3 comprises: a host computer 2; a network 3 connected to the host computer 2; client computers 6 and 7 connected to the network 3; a web server 21 connected to these client computers 6, 7, respectively; an application server 22 connected to the web server 21 and holding predetermined measurement application; a logic process server 10 comprising an image processing unit 15 and a recipe preparation unit 11 and connected to the application server 22; a schedule server 23 connected between the host computer 2 and the measurement apparatuses 4, 5 and connected to the logic process server 10; and a recipe/image database 24 connected to the measurement apparatuses 4, 5 and the logic process server 10 via the network 3.

A relational database management system (RDBMS) is a server which manages a relational database (RDB) to store all information from CDSEM, such as measurement data, image, recipe, error information, and apparatus status. In the mass-production plant, in addition to a large amount of routine measurement jobs executed by instruction of the host computer, a small amount of engineering measurement jobs are performed by an engineer for a purpose of improvement of the manufacturing process, measures against defects, or QC check of a manufacturing apparatus.

The schedule server 23 shown in FIG. 3 is preferably disposed in order to open the measurement system according to the second embodiment in the mass-production plant in such a manner that two types of jobs can utilize SEM measurement application logic with good efficiency. This schedule server 23 has a function of accumulating measurement requests from the host computer 2 and the user 6 or 7 and monitoring operation situations of the apparatus and priority of a measurement job to send the request to an apparatus optimum for executing the job. The server functions like a printer server.

Thus, the measurement system according to the second embodiment can be said to be a client-server system comprising: the client (user A or B) computer 6 or 7, and various servers 10, 21 to 23 for processing the request from the client computer 6 or 7. Here, the client is a requester, and the server is a provider. A system established on a relation between the requester and the provider is a client-server system.

A procedure will be described hereinafter in which the client receives the service of the measurement system according to the second embodiment. First, in a first procedure, the client issues a hyper text transport protocol (HTTP) request to the worldwide web (WWW) server 21. In a second procedure, when there is a client's request, Servlet starts on the WWW server, or applet is downloaded to the client computer 6 or 7. Servlet is Java program operating on the WWW server 21. As to a common gateway interface (CGI) normally used in the WWW server, the CGI application starts as one process every request from the user. On the other hand, Servlet is different in that the request can be processed as thread in one process. In a third procedure, Servlet acquires data by RDBMS or access via JDBC, and the result is converted into hyper text markup language (HTML) and transferred to the WWW server. In a fourth procedure, the WWW server transfers HTML to client's browser, or the downloaded applet is executed on the side of the client.

As described above, by the measurement system according to the second embodiment, it is possible for the user to receive the service of the measurement system according to the second embodiment from any terminal connected to the intranet (or internet) via WEB browser. For example, when a set of CDSEM data is handled as data warehouse (DWH), services such as visualization can be received by statistic data analysis or graph preparation tool by data mining in order to find data correlation or regularity which cannot be easily found by human intuition. Furthermore, logic of more sophisticated image analysis or the like is executed by the measurement system according to the second embodiment based on a CAD layout with respect to automatic preparation of the measurement recipe, measurement of OPC shape of reticle, line roughness measurement or the like to obtain the result, and this service is rendered to the client. The DWH refers to an intention determination support system (DSS) exclusive-use database constructed independently of a mainstay business system in such a manner that an end user easily extracts required information. The DWH is sometimes used as a concept indicating a method of constructing the database or end user's use environment.

In general, in the image processing, a load on a central processing unit (CPU) is large. When the application logic is disposed on the client side in the client-server system, many computer resources need to be mounted on the client side. As a result, client's costs are pushed up, and it is difficult to introduce the system. To solve the problem, the application logic is disposed on a server side in the measurement system of the second embodiment. High-speed image processing is executed by means such as an exclusive-use image processing board and PC cluster in accordance with the logic. Since the client receives the result only, the resources required for the client are only web browser and minimum plug-in.

This application logic can be disposed on the server side by network computing, and a system board is realized in which reliability of the client-server system, ease of using the web browser, and expandability of variance object are integrated. The network computing is constituted of three elements: client; application server; and data server, and they are in charge of user interface, application logic, and database management, respectively.

Among them, the application server fulfills a central function, and has a function of executing the application logic. The application server can move the application logic to the application server from the client in the network computing, and the client may mount the only web browser which is a light user interface. An environment is arranged which is capable of realizing concentrated management of the application. On the other hand, the CPU load for executing data entry is light, and network traffic can be reduced by the processing on the client side. In this case, Java applet is mounted as an application component onto the client. Even in this case, since the Java applet is downloaded at an execution time, management can be performed one-dimensionally on the server side.

In the mass-production plant, a large number of apparatuses operate including the measurement apparatus. For example, there is a possibility that a situation occurs in which the system starts a certain process or thread involving database access, and accordingly the access to several hundreds of images is sometimes required with respect to the database. Therefore, a transaction process having a high load is required. The transaction process refers to a process range or unit having one meaning in a computer system. The process is mainly a process unit for use in an online system or database system, and a process unit of (1) update process, (2) exclusive control, (3) log acquisition, and (4) trouble recovery. In this situation, it is important to secure scalability in such a manner that the system is capable of bearing a high load. Resistance to failure is important in such a manner that a non-stop operation can be realized. Moreover, ease of management is important. When the present system is introduced in the mass-production plant, needless to say, techniques have to be supported such as load balancing, pooling of database connection, and fail-over.

Here, the load balancing indicates that the process is scattered to a plurality of servers in order to enhance process performance, and this is a necessarily required large-scale application. As to the pooling of the database connection, if a session is produced with respect to the database management system (hereinafter referred to as DBMS) every request under the situation of high-load transaction, bottle neck may be made in the performance. Therefore, a method is performed in which the certain number of sessions with the DBMS are secured beforehand (pooling), and a large number of user requests are assigned to the sessions. Furthermore, in the function of the fail-over, even if one server breaks down, a substitute server takes over the process, and the whole system can continue the process so that the user does not feel the breakdown of the server.

The above-described measurement system has the following advantage. That is, a first advantage is that costs required for the client PC are largely reduced. In the network computing environment, even an inexpensive PC having low CPU performance can withstand practical use. A second advantage is that application management is completely unnecessary in the client, and management costs of the client can be reduced with respect to version management or the like. When the application is one-dimensionally managed, better support is possible with respect to a larger number of users. Accordingly, there is an advantage that bug correction or improvement of the application logic can be quickly performed. A third advantage is that an environment can be arranged in which anyone can easily access the system, if the client is simply connected to the network in the same manner as in the installment of a telephone set. Therefore, a large number of users can share the application logic. For example, there is an advantage that it is possible to instantaneously supply, to users in the world, the application logic of a new measurement method or the like. A fourth advantage is that the application logic can be easily changed, because the software component constitutes the application also in the management on the server side. Therefore, development speed of the application logic is effectively enhanced. A fifth advantage is that the application can be scattered to and executed by a plurality of servers, and operation burdens required for the server management can be largely reduced such as expansion of the system as needed. A sixth advantage is that the use method can be unified even in the measurement apparatus by another manufacturer. A seventh advantage lies in that data can be concentrated in one place, and a measure for security can be more easily taken. An eighth advantage is that use ratio of the application logic can be evaluated with definite numeral like the number of registered clients or the transaction to the server, and the amount used can be charged by the numeral.

Figure 4:
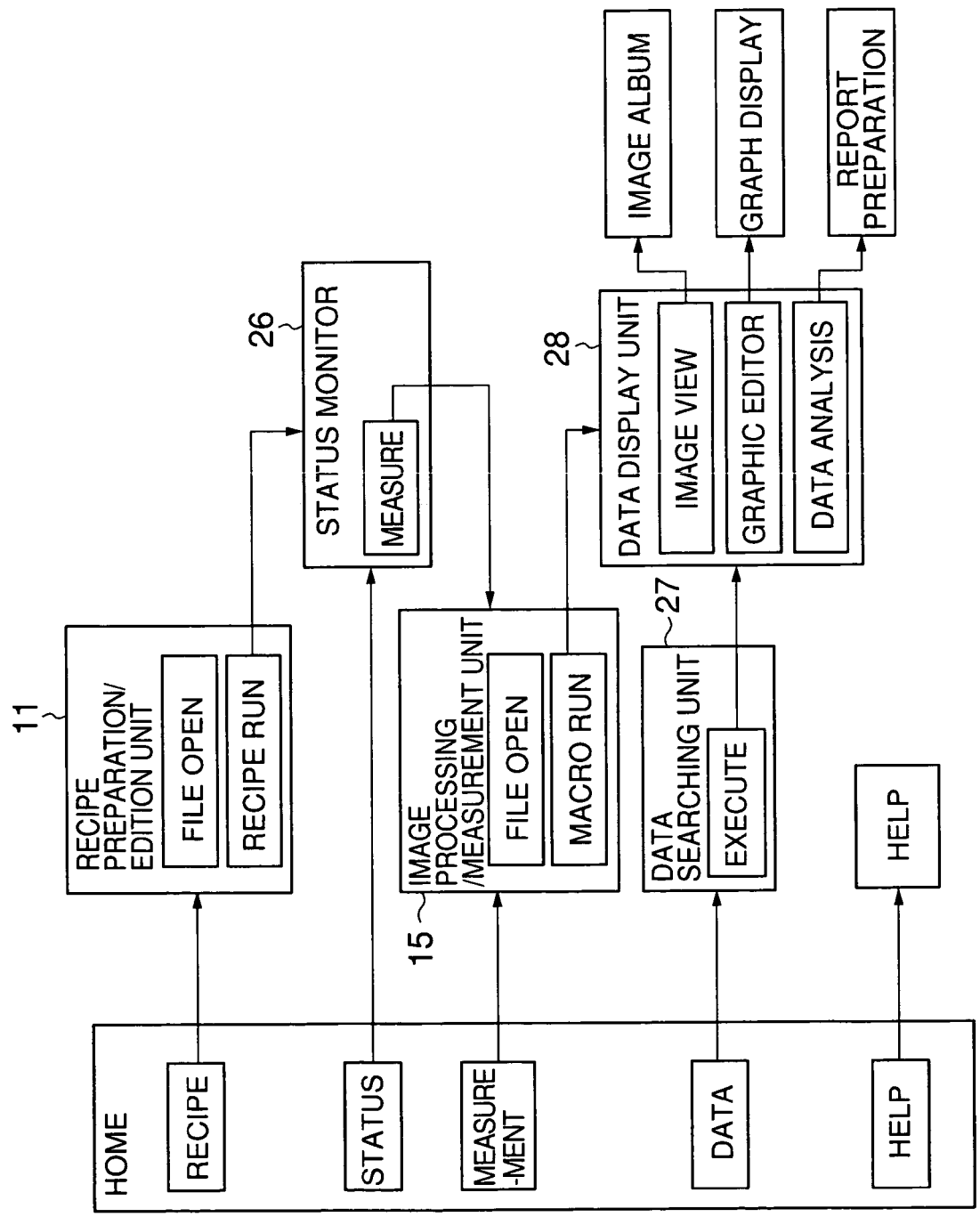
FIG. 4 is a block diagram showing a page structure in the measurement system according to a second embodiment shown in FIG. 3.

FIG. 4 shows a page structure in the measurement system of the second embodiment by the online measurement system shown in FIG. 3.

In this manner, the measurement system is a system in which it is possible to render a diverse service concerning the measurement apparatus with respect to the user via a single user interface which does not depend on the specific measurement apparatus. By the use of the system, effects can be expected such as enhancement of the development speed of the measurement algorithm and reduction of measurement cost. An actual work flow using the measurement system will be described in detail in the measurement system according to a third embodiment which is an example for automatically producing the recipe using the CAD data.

Third Embodiment

Figure 5:
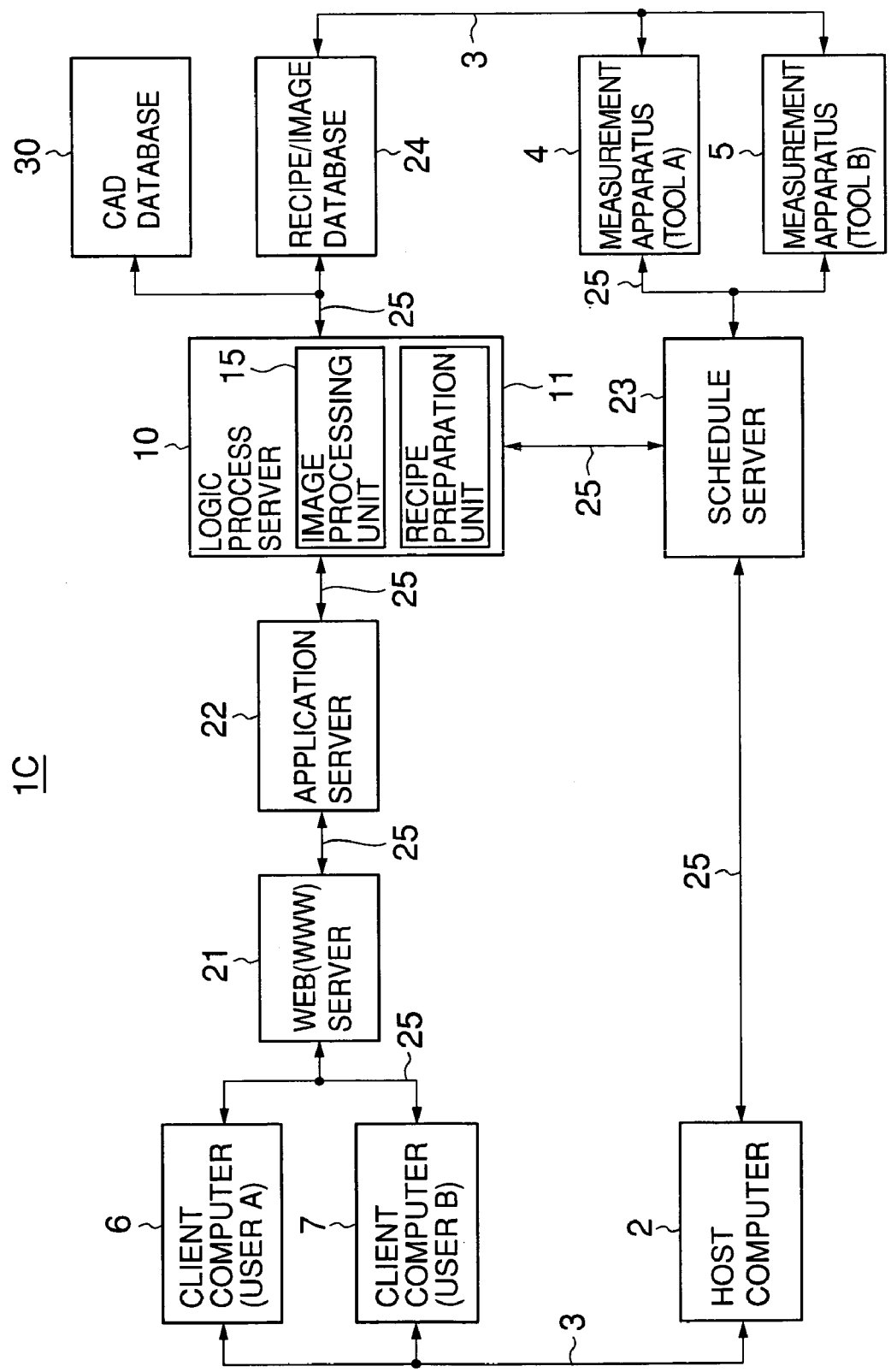
FIG. 5 is a block diagram showing a constitution of a measurement system according to a third embodiment applied to an online measurement system provided with a CAD database.
Figure 6:
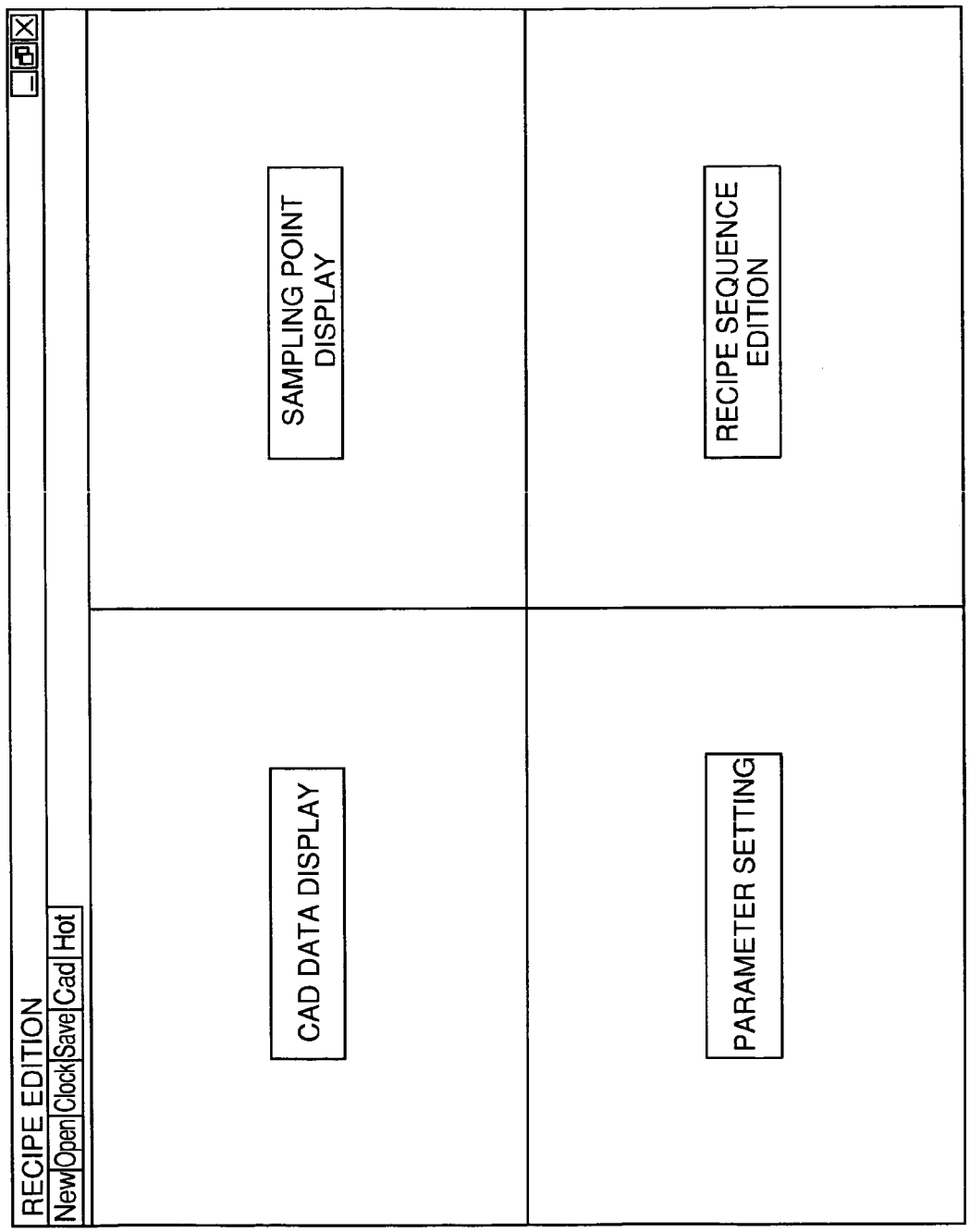
FIG. 6 is an explanatory view showing a display screen by GUI of a recipe preparation page in the measurement system of the third embodiment.
Figure 7:
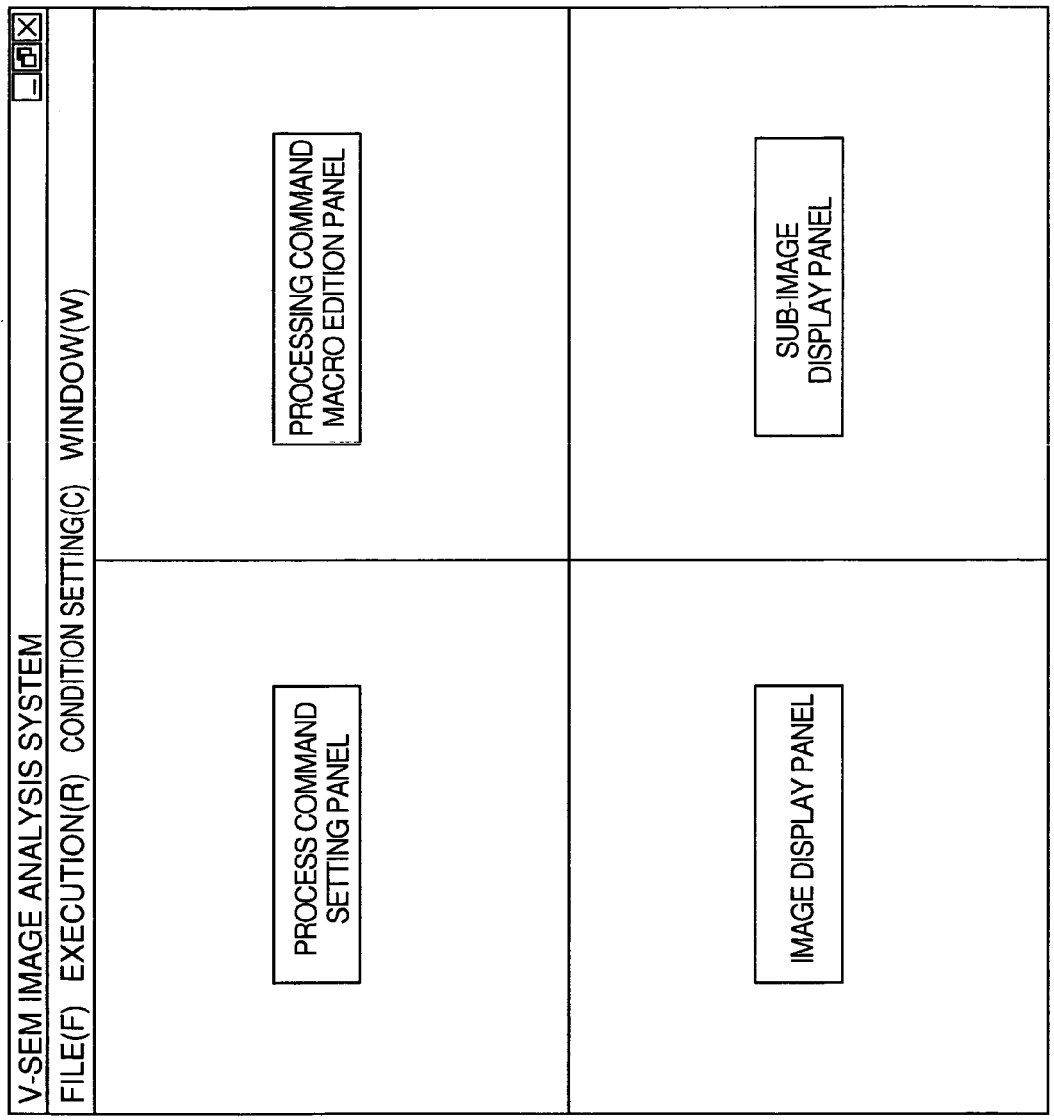
FIG. 7 is an explanatory view showing the display screen by the GUI of image processing/measurement execution in the measurement system of the third embodiment.

A service of a measurement system according to a third embodiment will be described in accordance with an example. In the example, the system supports automatic preparation of the recipe using CAD data. As shown in FIG. 5, in a measurement system 1C of the third embodiment, a CAD database 30 for the CAD data is added to the constitution of the measurement system 1B of the second embodiment shown in FIG. 3. In recipe preparation program which is usable from browser of a client PC described in the first embodiment, as shown in FIG. 6, a function of handling the CAD data is added as described by a format such as GDSII. Many CPU resources are required for development of a large-size binary file such as GDSII data. However, in the third embodiment, logic of the CAD data handling is disposed on a server side, and accordingly loads on a user side are reduced. FIG. 6 shows a graphic user interface (GUI) of a recipe preparation page in a measurement system of the third embodiment. A shown screen is provided with a CAD data display region, a sampling point display region, a parameter setting region, and a recipe sequence edition region. It is to be noted that FIG. 6 shows GUI of a recipe preparation/edition page shown in FIG. 4. The image processing/measurement page shown in FIG. 4 is shown as a screen of the GUI for image processing/measurement execution of FIG. 7. A screen of FIG. 7 comprises a process command setting panel region, a process command macro edition panel region, an image display panel region, and a sub-image display panel region.

In general, several tens of minutes are required to open the CAD data of about several GB even by a computer on which high-speed CPU is mounted. Therefore, thread is managed in such a manner as to prevent a logic process server from being occupied by one user. As a result of the logic, the user accesses the CAD database to open a desired CAD data file, and a pattern layout described in the CAD data can be displayed as an image in a browser. A place or magnification of the displayed CAD data can be set to values desired by the user via the GUI of the browser. Furthermore, the displayed image is cut out using the GUI of the browser, and can be registered as a template for recognizing the image. In this manner, the measurement recipe can be prepared using the pattern layout from the CAD data in the same manner as in a case where an SEM image is used from a wafer. In this case, the template for recognizing the image has to be converted into a format which can be recognized by an image recognition engine of the measurement apparatus, but this conversion is also executed by the logic process server. Processes are executed such as shape painting-over and corner rounding with respect to a CAD layout graphic, and the graphic may be registered as the template in order to enhance a success ratio of pattern recognition by a shape difference between the layout graphic of the CAD and SEM image of an actual pattern. It is to be noted that the image processing in this case is also executed by the logic process server.

As described above, the user may manually designate a place (measuring point coordinate) where measurement is to be actually performed on the wafer based on the CAD layout. However, when a dangerous place of the CAD layout is extracted by simulation or the like, and, as a result, coordinate and direction of each dangerous place (hot spot) are stored as a file in a database or the like, the file may be designated. According to this method, even when there are a large number of measuring points, user's trouble may be minimized. When the CAD data and the corresponding file of the hot spot are designated by the GUI of the browser, the logic process server executes the measuring point information production logic for converting the hot spot file into information required for measuring the measuring point coordinate or the like.

Furthermore, an image file of the CAD pattern for browser display and a template file for use in an image recognition engine of the apparatus are produced from CAD data in a region having an appropriate size centering on the measuring point coordinate, for example, a size twice a pattern size, for example, in X and Y directions. Since a format of the template file is inherent in the apparatus by a board or software for use, it is necessary to designate an apparatus in which a recipe is used during preparation of the recipe. The size or shape of the pattern to which the hot spot belongs is recognized by the measuring point information production logic. For example, an algorithm suitable for a line pattern is selected for a measurement magnification line pattern. In this manner, a measuring point coordinate, measurement magnification, measurement algorithm, template image, and measurement angle are read onto the user's browser. Various types of parameters can be changed by the GUI of an applet operating on a user's browser, and finally one measurement recipe is produced. This recipe may be stored in a recipe server connected to a network or any place besides recording media such as HD connected to a user's PC.

When the user simply designates CAD mask data of the wafer which is a measurement object in this manner, the recipe usable in the measurement system can be prepared without using any actual wafer. Therefore, as compared with a conventional case where the user manually designates and prepares the parameter, time can be largely produced. Moreover, since the apparatus is not occupied during the preparation of the recipe, the present embodiment also contributes to enhancement of an operation ratio of the apparatus.

Execution of the prepared recipe may be instructed from the measurement system, or the apparatus may execute the recipe alone. The image recognition template produced from the CAD data is different from the actual SEM image. Therefore, an operator sometimes needs to be assisted in a case where the recipe is executed for the first time. When the contents of the assist are stored to update the recipe, the recipe further grows into a recipe having high reliability. Furthermore, an option may be disposed in which the template is replaced with an actual image from the beginning in a case where there is a problem in the reliability of the matching by a CAD graphical template. When the recipe is operated together with means for enhancing the reliability of automation during execution of the prepared recipe, effects are further raised.

Merits will be described hereinafter in a case where the recipe is prepared using the measurement system with respect to the CAD data. First, time for which the apparatus is occupied can be reduced (actual operation ratio enhancement). Most of CDSEMs have a function of offline recipe preparation, but the recipe has to be prepared using the actual wafer and apparatus. Many varieties of products are produced in small amounts in Agile-FAB which attracts attentions as the next-generation mode of the plant, and therefore a large number of various recipes are required. In the present situations in which the apparatus is occupied by recipe preparation, there is a possibility that apparatus capacity is largely influenced. Actual operation ratio of the apparatus is enhanced by preparation of the recipe in the measurement system. Secondly, in the measurement system, when a first lot of wafers flow in the plant, a recipe preparer is required to work on 24-hour schedule from when the lot arrives at the plant. It is expected that burdens on the recipe preparer further increase in the above-described Agile-FAB. Therefore, the loads of the recipe preparer can be reduced.

Thirdly, when the recipe can be prepared in a wafer-less manner, the measurement system does not have to exist in a clean room, and an occupying area of the wafer is 0 in the clean room. Fourthly, since many varieties of products are passed in Agile-FAB, various patterns are supposed to be measured. In the measurement system, since the user can incorporate the measurement logic without influencing the measurement apparatus of the line, an experimental measurement method can be quickly verified. Therefore, various measurement methods can be provided. Fifthly, since the measurement system can be constituted only by equipment such as an PC, a part of the function can be realized very inexpensively as compared with a price of the measurement apparatus.

Fourth Embodiment

A measurement method according to a fourth embodiment will be described. A method according to the fourth embodiment for processing measurement data including image data and numerical data being obtained after measuring an object being finely processed and processing the measurement data, uses a measurement system 1A as shown in FIG. 1. The measurement system 1A includes at least one measurement apparatus 4 and/or 5 connected to a computer network, a client computer 6 and/or 7, and a server computer 10. The server computer 10 includes at least a setting edition unit 12, a notification unit 13, a data processing unit 16, and a result display unit 17.

Figure 9:
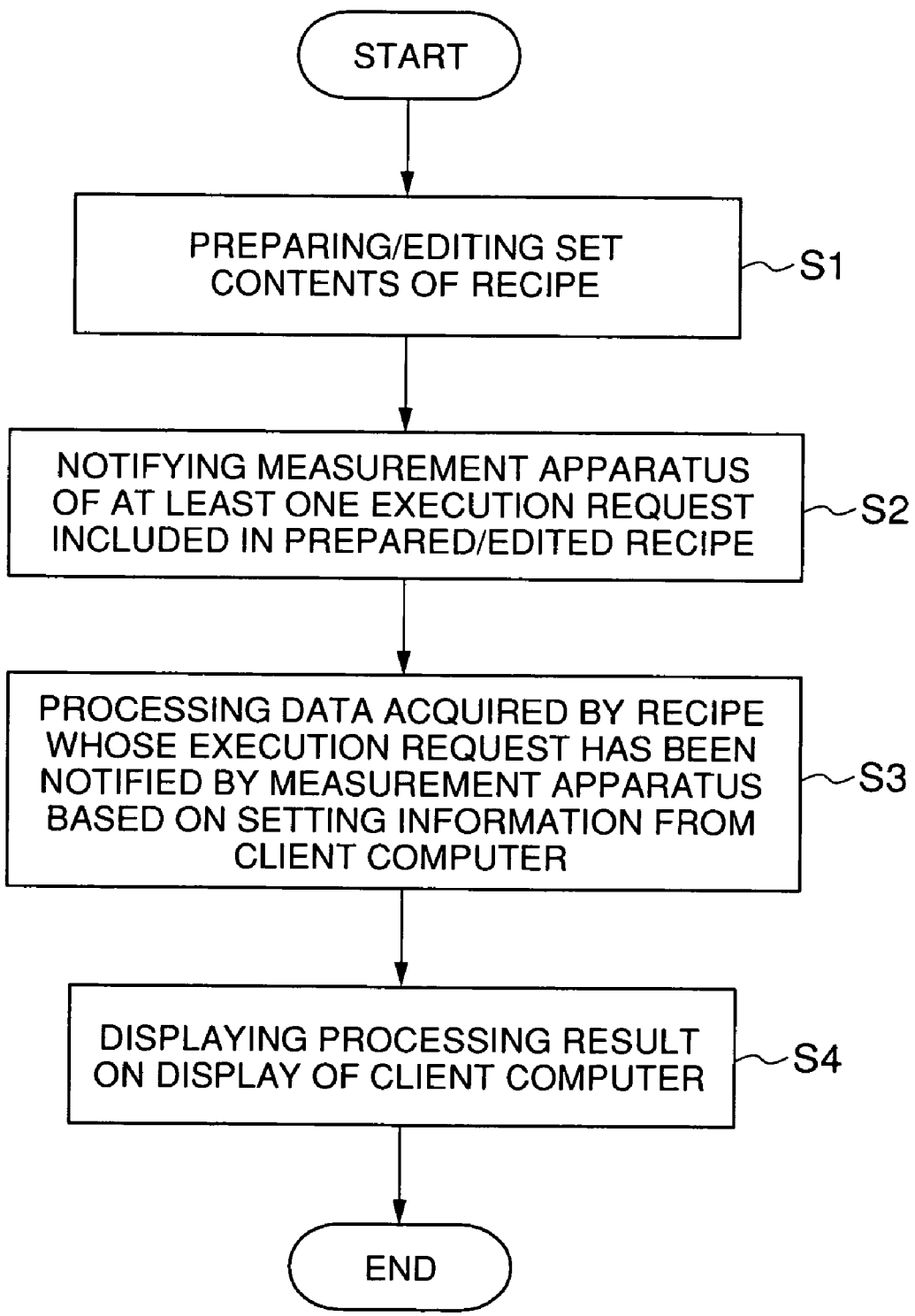
FIG. 9 is a flowchart showing steps in a measurement method of the fourth embodiment and in a measurement computer program of the fifth embodiment.

The method comprises, as shown in a flowchart of FIG. 9, a step S1 of preparing/editing set contents of a recipe of the measurement apparatus 4, 5 from the client computer 6,7 by the setting edition unit 13; a step S2 of notifying the measurement apparatus 4, 5 of at least one execution request included in the recipe prepared/edited by the client computer 6, 7 by the notification unit 13; a step S3 of processing data acquired by the recipe whose execution request has been notified by the measurement apparatus 4, 5 based on setting information input from the client computer 6, 7 by the data processing unit 16; and a step S4 of displaying a processing result of the data processing unit 16 in the client computer 6, 7 by the result display unit 17.

Fifth Embodiment

A computer program according to a fifth embodiment will be described. A computer program according to a fifth embodiment for measuring measurement data including image data and numerical data being obtained after measuring an object being finely processed and processing the measurement data, uses a measurement system 1A, as shown in FIG. 1. The measurement system 1A includes at least one measurement apparatus and/or 5 connected to a computer network, a client computer 6 and/or 7, and a server computer 10. The server computer 10 includes at least a setting edition unit, a notification unit, a data processing unit, and a result display unit.

The computer program comprises, as shown in FIG. 9, a step S1 of preparing/editing set contents of a recipe of the measurement apparatus 4, 5 from the client computer 6, 7 by the setting edition unit 12; a step 52 of notifying the measurement apparatus of at least one execution request included in the recipe prepared/edited by the client computer by the notification unit 13; a step S3 of processing data acquired by the recipe whose execution request has been notified by the measurement apparatus 4, 5 based on setting information input from the client computer 6, 7 by the data processing unit 16; and a step S4 of displaying a processing result of the data processing unit 16 in the client computer 6, 7 by the result display unit 17.

Based on the above-described basic constitution, for example, the client-server system comprises: a measurement apparatus such as CDSEM connected to a network; a database in which an image, recipe and the like are stored; a server in which an application logic of recipe preparation or measurement algorithm of the measurement apparatus is stored; a web server and the like. By this system, the user receives services, from a single user interface, such as preparation of recipes of a plurality of types of measurement apparatuses, measurement job management, and quality control (QC) measurement, and the application logic can be shared.

What is claimed is:

1. A measurement system of a pattern for a semiconductor device comprising:
    a first measurement apparatus which acquires a first image of the pattern;
    a second measurement apparatus which acquires a second image of the pattern; and
    a server computer which is connected to the first and second measurement apparatus, the server computer including:
    a recipe preparation unit configured to prepare a first recipe of a measurement sequence for the first measurement apparatus and a second recipe of a measurement sequence for the second measurement apparatus, the first and second recipe being prepared on the basis of recipe parameter information from a client computer, the first and second recipe including at least one execution request;
    a notification unit configured to notify the first and second measurement apparatus of the execution requests;
    an image processing unit configured to process the first image of the pattern acquired using the first recipe and to process the second image of the pattern acquired using the second recipe; and
    a result display configured to display on a display unit of the client computer a processing result of the image processing unit;
    wherein the first recipe is formatted specifically to the first measurement apparatus, and the second recipe is formatted differently from the first recipe and specifically to the second measurement apparatus.

2. The measurement system according to claim 1, further comprising a host computer which is connected to and controls the first and second measurement apparatus, wherein the recipe preparation unit includes:
    a code notification function to produce an inherent identification code with respect to the execution request of the first or second recipe to notify the first measurement apparatus, second measurement apparatus, or the host computer; and
    an image display processing function to display an image on the display unit of the client computer referring to the identification code of an image output from the first or second measurement apparatus, to which the inherent identification code has been added.

3. The measurement system according to claim 2, wherein the first or second measurement apparatus is a CDSEM, the image output from the first or second measurement apparatus is a SEM image; and the image processing unit processes the SEM image, and measures a pattern to obtain a numerical value.

4. The measurement system according to claim 1, wherein the server computer further includes:
   an update function to update the first or second recipe prepared based on the recipe parameter information from the client computer; and
   a transfer function to transfer the updated first or second recipe to the first or second measurement apparatus.

5. The measurement system according to claim 1, wherein the recipe preparation unit of the server computer includes a changing function to convert a format of the first or second recipe into a format corresponding to the first or second measurement apparatus.

6. The measurement system according to claim 1, wherein the client computer or a part of the client computer is a production management computer of a mass-production plant, and a request for execution of the first or second recipe is output from the production management computer.

7. The measurement system according to claim 1, wherein the first measurement apparatus, the second measurement apparatus, the server computer, and the client computer are connected to a computer network.

8. The measurement system according to claim 7, wherein the computer network is intranet or internet, the server computer is a worldwide web (WWW) server, an application server, or a database server, and a user receives a service of the system via a browser on the client computer.

9. The measurement system according to claim 1, wherein the first measurement apparatus and the second measurement apparatus are controlled by the client computer through the server computer by sending the recipe parameter information from the client computer to the server computer, formatting the first recipe and the second recipe in the server computer, and sending, from the server computer, the formatted first recipe to the first measurement apparatus and the formatted second recipe to the second measurement apparatus.

10. A method of measuring a pattern for semiconductor device by using a measurement system which includes a first measurement apparatus, a second measurement apparatus, and a server computer having an image processing unit and a recipe preparation unit, the method comprising:
   preparing a first recipe of a measurement sequence for the first measurement apparatus and a second recipe of a measurement sequence for the second measurement apparatus, the first and second recipe being prepared by the recipe preparation unit on the basis of recipe parameter information from a client computer, the first and second recipe including at least one execution request;
   notifying the first and second measurement apparatus of at least one of the execution requests;
   acquiring an image of the pattern to be measured by the first or second measurement apparatus;
   processing the image from the first or second measurement apparatus to output a processing result by the image processing unit; and
   displaying on a display unit of the client computer the processing result of the image processing unit;
   wherein the first recipe is formatted specifically to the first measurement apparatus, and the second recipe is formatted differently from the first recipe and specifically to the second measurement apparatus.

11. The method according to claim 10, wherein the measurement system further comprises a host computer which is connected to and controls the first and second measurement apparatus, and the method further comprises:
   notifying an inherent identification code after producing the code with respect to the execution request of the first or second recipe to the first measurement apparatus, the second measurement apparatus, or the host computer; and
   displaying the image on the display unit of the client computer referring to the identification code of the image output from the first or second measurement apparatus, to which the inherent identification code has been added.

12. The method according to claim 10, further comprising:
   updating the first or second recipe by the recipe preparation unit; and
   transferring the updated first or second recipe to the first or second measurement apparatus by the recipe preparation unit.

13. The method according to claim 10, further comprising converting a format of the first or second recipe into a format corresponding to the first or second measurement apparatus, by the setting edition unit.

14. The method according to claim 10, wherein the client computer or a part of the client computer is a production management computer of a mass-production plant, and a request for execution of the first or second recipe is output from the production management computer.

15. The method according to claim 10, wherein the first or second measurement apparatus is a CDSEM, the image is an SEM image, and the image processing unit processes the SEM image, and measures a pattern to obtain a numerical value.

16. The method according to claim 10, wherein the first measurement apparatus, the second measurement apparatus, the server computer, and the client computer are connected to a computer network.

17. The method of measuring a semiconductor device according to claim 16, wherein the computer network is intranet or internet, the server computer is a worldwide web (WWW) server, an application server, or a database server, and a user receives a service of the system via a browser on the client computer.

18. A computer readable medium storing a program which causes a measurement system to execute a method of measuring a pattern for a semiconductor device, the measurement system including a first measurement apparatus, a second measurement apparatus, and a server computer having an image processing unit and a recipe preparation unit, the method comprising:
   preparing a first recipe of a measurement sequence for the first measurement apparatus and a second recipe of a measurement sequence for the second measurement apparatus, the first and second recipe being prepared by the recipe preparation unit on the basis of recipe parameter information from a client computer, the first and second recipe including at least one execution request from a client computer;
   notifying the first and second measurement apparatus of the execution requests;
   acquiring an image of the pattern to be measured by the first or second measurement apparatus;
   processing the image from the first or second measurement apparatus to output a processing result by the imagine processing unit; and
   displaying on a display unit of the client computer the processing result of the image processing unit;
   wherein the first recipe is formatted specifically to the first measurement apparatus, and the second recipe is formatted differently from the first recipe and specifically to the second measurement apparatus.

19. The computer-readable medium according to claim 18, wherein the measurement system further comprises a host computer which is connected to and controls the first and second measurement apparatus, and the method further comprises:

notifying an inherent identification code after producing the code with respect to the execution request of the first or second recipe to the first measurement apparatus, second measurement apparatus, or the host computer; and displaying the image on the display unit of the client computer referring to the identification code of the image output from the first or second measurement apparatus, to which the inherent identification code has been added.

20. The computer-readable medium according to claim 18, wherein the method further comprises:

updating the first or second recipe by the recipe preparation unit; and transferring the updated first or second recipe to the first or second measurement apparatus by the recipe preparation unit.

21. The computer-readable medium according to claim 18, wherein the method further comprises converting a format of the first or second recipe into a format corresponding to the first or second measurement apparatus, by the recipe preparation unit.

22. The computer-readable medium according to claim 18, wherein the client computer or a part of the client computer is a production management computer of a mass-production plant, and a request for execution of the first or second recipe is output from the production management computer.

23. The computer-readable medium according to claim 18, wherein the first measurement apparatus, the second measurement apparatus, the server computer, and the client computer are connected to a computer network.

24. The computer-readable medium according to claim 23, wherein the computer network is intranet or internet, the server computer is a worldwide web (WWW) server, an application server, or a database server, and a user receives a service of the system via a browser on the client computer.

\* \* \* \* \*